United States Patent [19]
Tran

[11] Patent Number: 5,894,434
[45] Date of Patent: *Apr. 13, 1999

US005894434A

[54] MOS STATIC MEMORY ARRAY

[75] Inventor: Hiep Van Tran, Dallas, Tex.

[73] Assignee: Texas Instruments Incorporated, Dallas, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/770,756

[22] Filed: Dec. 19, 1996

[51] Int. Cl.[6] ............................................. G11C 11/00
[52] U.S. Cl. ................................... 365/156; 365/191
[58] Field of Search .............................. 365/191, 206, 365/154, 156

[56] References Cited

U.S. PATENT DOCUMENTS

| | | | |
|---|---|---|---|
| 3,493,786 | 2/1970 | Ahrons | 365/156 |
| 4,404,657 | 9/1983 | Furuyama | 365/154 |
| 4,661,928 | 4/1987 | Yasuoka | 365/206 |
| 5,070,482 | 12/1991 | Miyaji | 365/154 |
| 5,105,100 | 4/1992 | Yamada | 307/272.2 |
| 5,107,137 | 4/1992 | Kinugasa et al. | 307/272.2 |
| 5,173,626 | 12/1992 | Kudou et al. | 307/481 |
| 5,317,205 | 5/1994 | Sato | 307/443 |
| 5,392,235 | 2/1995 | Nishitani | 365/154 |
| 5,465,230 | 11/1995 | Montegari | 365/168 |
| 5,490,111 | 2/1996 | Sakata | 365/191 |
| 5,568,435 | 10/1996 | Marr | 365/154 |
| 5,612,632 | 3/1997 | Mahant-Shetti et al. | 326/46 |

OTHER PUBLICATIONS

"Dynamic MOS RAM'S", R. Proebsting, ICC'77 Chicago, IEEE Catalog No. 77CH1209-6 CSCB, Conference Record vol. 3, pp. 43,4-147-43,4-150.

Primary Examiner—A. Zarabian
Attorney, Agent, or Firm—Robby T. Holland; Carlton H. Hoel; Richard L. Donaldson

[57] ABSTRACT

A semiconductor static random access memory (RAM) array (10) is disclosed. The static RAM array (10) includes a plurality of memory cells (12), where each memory cell (12) is coupled to a write enable switch (34). The write enable switch (34) responsive to a write enable signal (36) is coupled between each memory cell (12) and a voltage source (27) or a voltage ground (29). The write enable switch (34) can disconnect each memory cell (12) from either the voltage source (27) or the voltage ground (29) responsive to the write enable signal.

5 Claims, 6 Drawing Sheets

MOS STATIC MEMORY ARRAY

TECHNICAL FIELD OF THE INVENTION

The present invention relates generally to the field of electronic devices and more particularly to an improved metal oxide semiconductor (MOS) static random access memory (RAM) array.

BACKGROUND OF THE INVENTION

The memory cells in a semiconductor static random access memory (RAM) array typically require 6 transistors (6T). Four of these transistors are coupled as a cross-coupled latch and provide storage of a logical "1" or "0." The two additional transistors are used as pass transistors, to couple the memory cell to complementary bit lines. To write a bit to a memory cell location, a word line for the cell is selected, which turns on the pass transistors. The complementary bit lines are then charged to opposite states by a writer-driver circuit, causing the memory cell to store the selected bit. The bit stored in the memory cell may be read by a sense amplifier that measures the difference in voltage between the two bit lines. Reversing the voltages on the bit lines forces the transistors to change states and store the alternate bit. Although it is understood that such semiconductor static RAM arrays may be used with any kind of transistor, metal-oxide semiconductor (MOS) transistors will be used herein for exemplary purposes.

Five transistor (5T) MOS static RAM cells have been previously developed that use a single bit line instead of a pair of complementary bit lines and thus only require a single pass transistor. It is more difficult to write a logic 1 to a 5T MOS static RAM cell that is storing a logic 0 as compared to a 6T MOS static RAM cell that is storing a logic 0, because the process of writing a logic 1 to the 5T cell includes applying a logical high voltage to a node that is initially nearly at ground voltage. Thus, it is difficult to raise this node voltage high enough to cause the non-conducting transistors in the cell to change state so that the logical 1 may be written to the cell.

Several methods have been recommended to overcome this problem with 5T MOS static RAM cells, but these methods involve the use of alternate voltage levels for bit lines and word lines that are difficult to implement in practice. These methods are also difficult to implement in a low voltage and low power application, and are impractical for an application specific integrated circuit (ASIC) design.

SUMMARY OF THE INVENTION

Therefore, a need has arisen for a 5T MOS static RAM memory cell that is compatible with a low voltage and low power technology.

A need has also arisen for a 5T MOS static RAM array that may be implemented within an ASIC design.

According to one aspect of the present invention, a static RAM array is disclosed. The static RAM array includes a plurality of memory cells, and each memory cell is coupled to a write enable switch that is responsive to a write enable signal. The write enable switch is coupled between each memory cell and a voltage source or a voltage ground. The write enable switch can disconnect a memory cell from either the voltage source or the voltage ground in response to the write enable signal.

Another aspect of the present invention is method for improving the operation of a static RAM array. The method includes the step of disconnecting a memory cell in the array from either the voltage source or the voltage ground responsive to a write enable signal when writing a logic 1 to that memory cell.

Yet another aspect of the present invention is a semiconductor static RAM array that includes a write enable switch responsive to a write enable signal and a plurality of memory cells. Each memory cell of the array includes a first P-channel MOS transistor having a source coupled to a high voltage supply, a drain, and a gate, and a first N-channel MOS transistor having a drain coupled to the drain of the first P-channel MOS transistor. The first N-channel transistor also has a gate coupled to the gate of the first P-channel MOS transistor, and a source coupled to the write enable switch. Each memory cell also includes a second P-channel MOS transistor having a source coupled to the high voltage supply, a drain, and a gate coupled to the drain of the first P-channel MOS transistor, and a second N-channel MOS transistor having a drain coupled to the drain of the second P-channel MOS transistor, a gate coupled to the gate of the second P-channel transistor, and a source coupled to a voltage ground. These four transistors form a cross-coupled latch, which is accessed by a third N-channel MOS transistor having a drain coupled to a bit line, a gate coupled to a word line, and a source coupled to the drain of the first N-channel transistor. The array also includes a noise reduction circuit coupled to the write enable switch, which includes a current source operable to conduct current from the memory cell to ground and a switch operable to couple and decouple the memory cell from the current source. A write enable circuit is also connected to the array at the write enable switch. The write enable circuit includes a reference voltage having a magnitude lower than the voltage of the voltage source and a MOS transistor operable to connect the reference voltage to each memory cell.

An important technical advantage of the present invention is the ability to implement a 5T MOS static RAM array with a low voltage and low power technology.

A further technical advantage of the present invention is the ability to implement a 5T MOS static RAM array within an ASIC design.

Another technical advantage of the present invention is the ability to obtain a higher density of memory cells by using only five transistors per memory cell as opposed to the six transistors usually required for a memory cell.

Yet another technical advantage of the present invention is the ability to use two independent bit lines with a 6T MOS static RAM array that are both fully functional to read and write data to the memory cell independent of the other.

BRIEF DESCRIPTION OF THE DRAWINGS

For a more complete understanding of the present invention and the advantages thereof, reference is now made to the following descriptions taken in connection with the accompanying drawings in which like numbers indicate like features, and wherein.

DETAILED DESCRIPTION OF THE INVENTION

The preferred embodiments of the present invention are illustrated in the FIGURES, like numerals being used to refer to like and corresponding parts of the various drawings.

Figure 1:
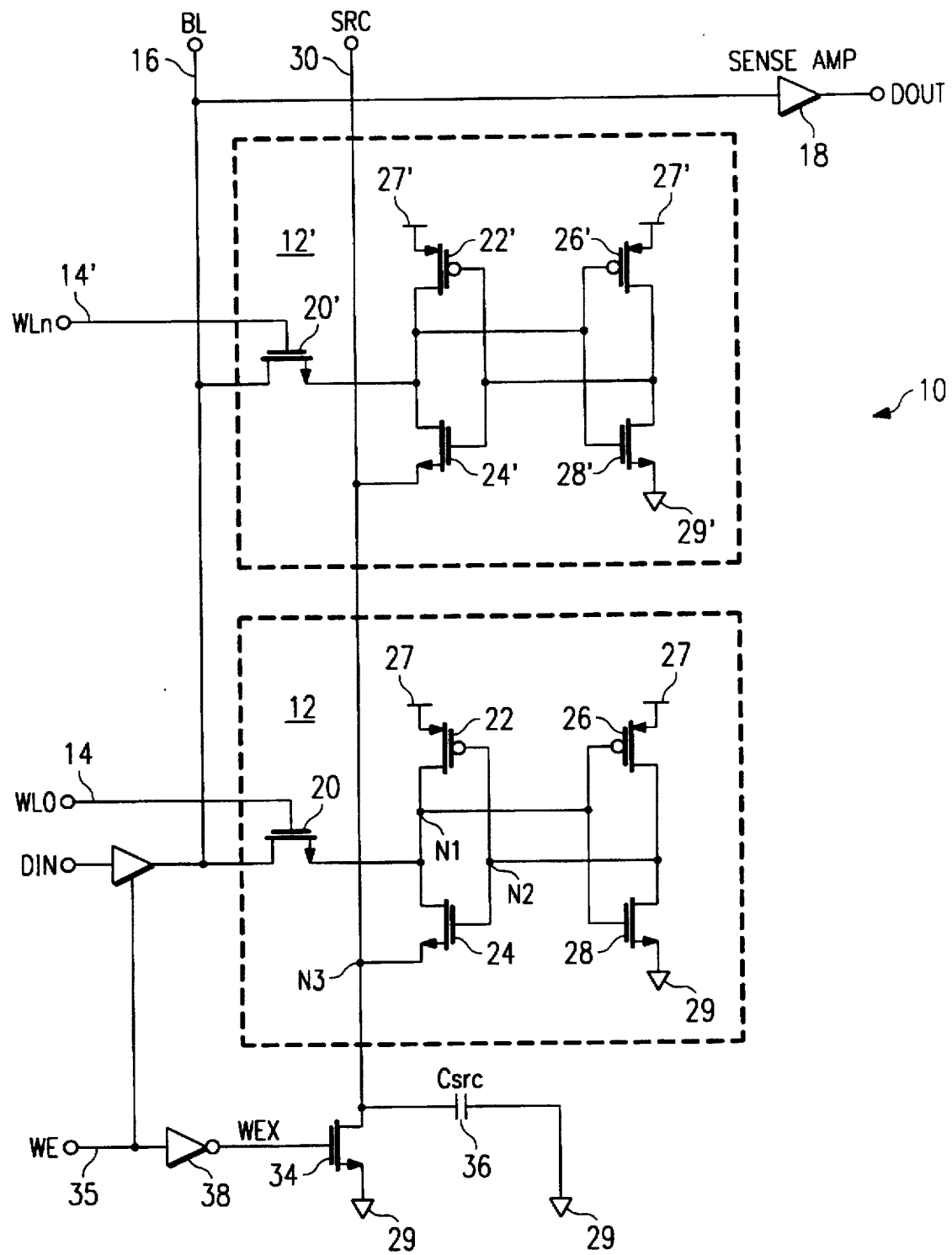
FIG. 1 presents an exemplary 5T MOS static RAM memory cell embodying concepts of the present invention.

FIG. 1 is an electrical schematic diagram of 5T MOS static RAM array 10 embodying concepts of the present invention. Array 10 as shown in FIG. 1 contains two memory cells 12 and 12'. Each memory cell is accessible by word line (WL) 14 or 14', respectively, and bit line (BL) 16. Array 10 is read by sense amp 18 coupled to BL 16 that is operable to determine whether BL 16 is at logic 0 or logic 1.

Each memory cell 12 contains gate transistor 20. Gate transistor 20 may be either an N-channel or a P-channel MOS transistor, but is an N-channel MOS transistor in the embodiment shown in FIG. 1. The drain of gate transistor 20 is coupled to BL 16, the gate of gate transistor 20 is coupled to WL 14, and the source of gate transistor 20 is coupled to Node 1 (N1) of memory cell 12.

Memory cell 12 includes four MOS transistors coupled as a cross-coupled latch. These four transistors may be an appropriate combination of N-channel and P-channel transistors, but in the embodiment shown in FIG. 1 two of the transistors are P-channel MOS transistors (transistor 22 and transistor 26) and two are N-channel MOS transistors (transistor 24 and transistor 28). The sources of transistors 22 and 26 are coupled to source voltage 27, which is at a voltage of $V_s$. The drain of transistor 22 is coupled to the drain of transistor 24, and the drain of transistor 26 is coupled to the drain of transistor 28 at Node 2 (N2), as shown. The gates of transistor 22 and transistor 24 are tied together and coupled to the drains of transistor 26 and transistor 28. Likewise, the gates of transistor 26 and transistor 28 are tied together and coupled to the drains of transistor 22 and transistor 26. The drain of gate transistor 20 is coupled to the drains of transistor 22 and transistor 24, which is identified as N1. The voltage at N1 determines the bit stored in memory cell 12, i.e. a voltage of approximately $V_s$ is read as a logical 1, and a voltage of approximately ground voltage 29 ($V_g$) is read as a logical 0. The source of transistor 28 is coupled to ground voltage 29.

The source of transistor 24 of is coupled to write enable transistor 34 at Node 3 (N3). Write enable transistor 34 is essentially a write enable switch that may be coupled between memory cell 12 and either ground voltage 29 or source voltage 27. Write enable transistor 34 may be either an N-channel MOS transistor or a P-channel MOS transistor, but in the embodiment shown in FIG. 1 is an N-channel MOS transistor. The drain of write enable transistor 34 is coupled to the source of transistor 24. The node where this connection is made is referred to as source node 30, and is also identified in FIG. 1 as N3. Source capacitance 36 is the inherent capacitance of source node 30 as coupled to each memory cell 12, but may be augmented by additional capacitance if desired.

It is noted that each memory cell 12 in array 10 is implemented with the identical configuration. The elements in cell 12' have corresponding reference numbers as those in cell 12, e.g. 22' and 24'.

In operation, the data stored in memory cell 12 is read by selecting WL 14 and BL 16 coupled to that cell. WL 14 is selected by raising the voltage to a logic 1, which typically equals $V_s$. When WL 14 has been selected, gate transistor 20 for that specific memory cell 12 will be turned on. If memory cell 12 is holding a logic 1, transistors 24 and 26 are off and transistors 22 and 28 are on. This forces the voltage at N1 to be approximately $V_s$, and the voltage at N2 to be approximately $V_g$. Sense amp 18 will detect the voltage on bit line 16 and N2 that is approximately equal to $V_s$ and will interpret it as a logic 1. Likewise, if memory cell 12 is storing a logic 0, transistors 22 and 28 are on and transistors 24 and 26 are off. Sense amp 18 will detect a voltage approximately equal to $V_g$ on BL 16 and N1, which will be interpreted as a logic 0.

A similar procedure is used to write data to memory cell 12. If memory cell 12 is at logic 1, transistors 24 and 26 are on and transistors 22 and 24 are off. To write a logic 0 to memory over a logic 1, WL 14 for memory cell 12 is chosen, and a voltage equal to logic 0 is impressed on BL 16 and subsequently N1. When N1 is held to logic 0, transistor 28 is turned off, and transistor 26 is turned on, which raises the voltage at N2 to approximately $V_s$ and turns on transistor 24 while turning off transistor 22. Thus, memory cell 12 stores the logic 0.

Nevertheless, as can be seen in FIG. 1, subsequently writing a logic 1 to memory cell 12 when it is currently storing a logic 0 would be problematic without write enable transistor 34. In the absence of write enable transistor 34, the source of transistor 24 would be coupled to ground voltage 29, ($V_g$). If memory cell 12 is at logic 0, transistor 28 is off and transistor 26 is on, forcing the voltage at N2 to equal approximately $V_s$. This in turn causes transistor 22 to be off and transistor 24 to be on; forcing N1 to a voltage approximately equal to $V_g$.

Thus, even though a logic 1 is being impressed on N1, N1 is being held to a lower voltage and might not rise a sufficient amount to cause transistors 26 and 28 to change state. With write enable transistor 34 as shown, during a write operation the source of transistor 24 is allowed to float. This allows N1 to reach a sufficiently high voltage to cause transistors 26 and 28 to change states. This in turn causes the voltage at N1 to increase to approximately $V_s$, which turns transistor 26 on and transistor 28 off, forcing the voltage at N1 to approximately $V_s$ and subsequently storing a logic 1.

Write enable transistor 34 is turned on during a read operation by write enable (WE) signal 35 and signal inverter 38. During a read operation, WE signal 35 is at logic 0, forcing the signal through signal inverter 38 to logic 1 and turning on write enable transistor 34. Source node 30 is thus held to a voltage approximately equal to $V_g$, allowing sense amp 18 to detect either a logic 0 or a logic 1 when BL 16 and WL 14 for a specific memory cell 12 are selected. During a write operation, WE signal 35 is at logic 1, forcing the signal through signal inverter 38 to logic 0 and turning off write enable transistor 34. This allows source node 30 to float and assists the write operation, as previously described.

It is also evident from FIG. 1 that source capacitance 36 will delay the rise time of the voltage seen at N3. As previously noted, source capacitance 36 is a function of the design of source node 30 and memory cells 12. Without modification, source capacitance 36 may limit the effectiveness of write enable transistor 34.

Figure 2:
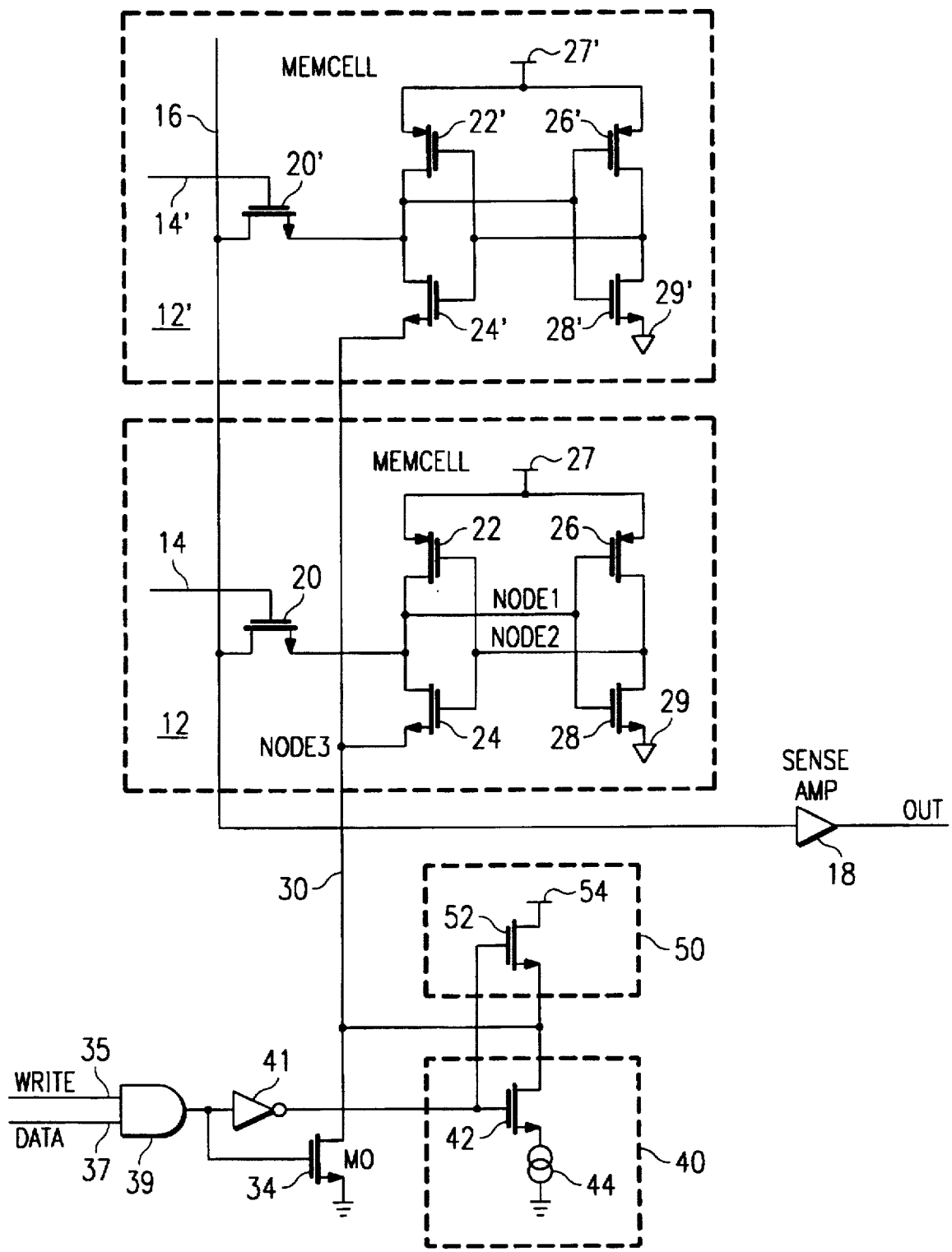
FIG. 2 shows an exemplary 5T MOS static RAM memory cell embodying concepts of the present invention also having a noise reduction circuit and a write enable circuit.

FIG. 2 is an exemplary 5T MOS static RAM array that is similar to array 10 in FIG. 1 but also includes noise reduction circuit 40 and write enable circuit 50. Write enable circuit 50 helps to reduce the delay caused by source capacitance 36, and includes transistor 52 and reference voltage 54. Transistor 52 may be either a P-channel or an N-channel MOS transistor, but is an N-channel MOS transistor in the embodiment shown in FIG. 2. The drain of transistor 52 is coupled to reference voltage 54. Reference voltage 54 is a predetermined voltage that is lower in magnitude than $V_s$. The source of transistor 52 is coupled to N3. The gate of transistor 52 is coupled to the output of signal inverter 41, which inverts the output of NAND gate 39. The inputs to NAND gate 39 are WE signal 35 and data signal 37. In operation, when WE signal 35 is at logic high, transistor 52 is on, thus forcing N3 to reference voltage 54.

Noise reduction circuit 40 is connected in a similar manner. Circuit 40 includes transistor 42 and current source 44. Transistor 42 may be either a P-channel or an N-channel MOS transistor, but is an N-channel MOS transistor in the embodiment shown in FIG. 2. The drain of transistor 42 is coupled to N3. The gate of transistor 42 is coupled to the output of signal inverter 41, which inverts the output of NAND gate 39. The inputs to NAND gate 39 are WE signal 35 and data signal 37. The source of transistor 42 is coupled to current source 44. Current source 44 is operable to conduct current from N3 to ground. In operation, when WE signal 35 is at logic 1 and data of logic 1 is entered, both noise reduction circuit 40 and write enable circuit 50 are activated. Write enable circuit 50 increases the voltage at N3 to an intermediate voltage. This voltage reduces the amount of time required for the logic 1 applied to BL 16 to raise the voltage at N1 to a level that will cause transistors 26 and 28 to switch on and change the state of memory cell 12 from logic 0 to logic 1.

As can be seen in FIGS. 1 and 2, source node 30 is coupled to the source of transistor 24 in each memory cell 12. This configuration creates the potential for each memory cell 12 coupled to source node 30 to change state to logic 1 even though each WL 14 to each memory cell 12 has not been selected. Noise reduction circuit 40 is operable to prevent this from occurring. After write enable circuit 50 raises the voltage at N3 to reference voltage 54, noise reduction circuit 40 prevents the voltage at N3 from being pulled up by the voltage at N1. Noise reduction circuit 40 accomplishes this by draining off any charge that may accumulate at N3 that would otherwise raise the voltage at N3 above reference voltage 54.

Figure 3:
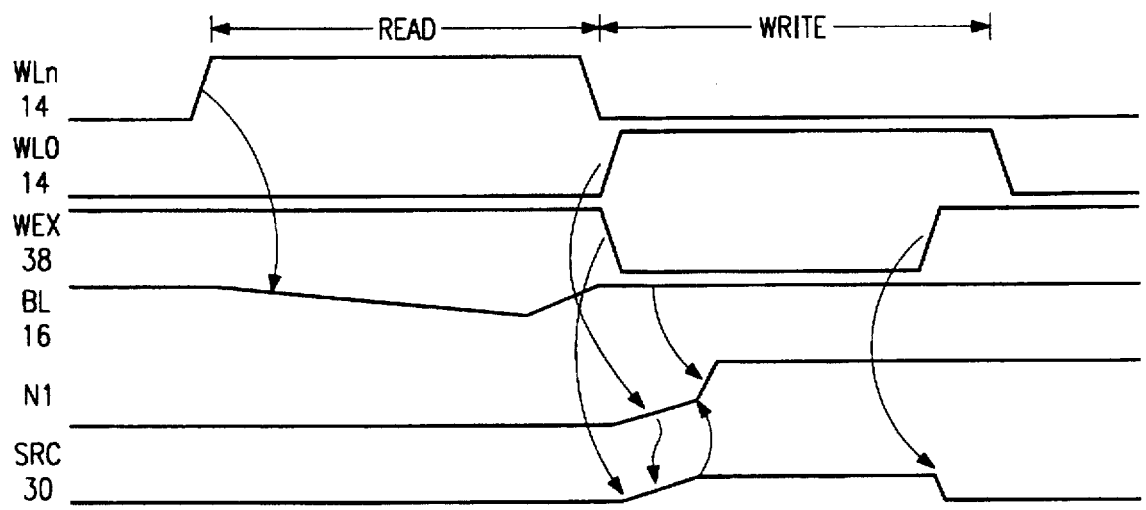
FIG. 3 illustrates an exemplary timing diagram for a 5T MOS static RAM memory cell in accordance with the present invention.

FIG. 3 shows an exemplary timing diagram for a 5T MOS static RAM array incorporating concepts of the present invention. During the read sequence shown, the output of signal inverter 38 (WEX) is a logic 1. BL 16, which outputs a voltage equal to a stored logic 1, is pulled down towards the logic 0 imposed at N1. As shown in the write sequence, WE signal 35 output from signal inverter 38 drops to logic 0 during the write. Applying logic 1 to N1 causes the node voltage to increase slowly. The voltage at N3 also increases slowly, but does not reach the voltage reached by N1 because of the voltage drop across transistor 24. Once source capacitance 36 has been charged, the rate of rise of the voltage of N1 increases because of the availability of additional electrical charge that was being used to charge source capacitance 36. Pre-charging N1 with write enable circuit 50 allows the voltage at N1 to reach its maximum value more rapidly.

Figure 4:
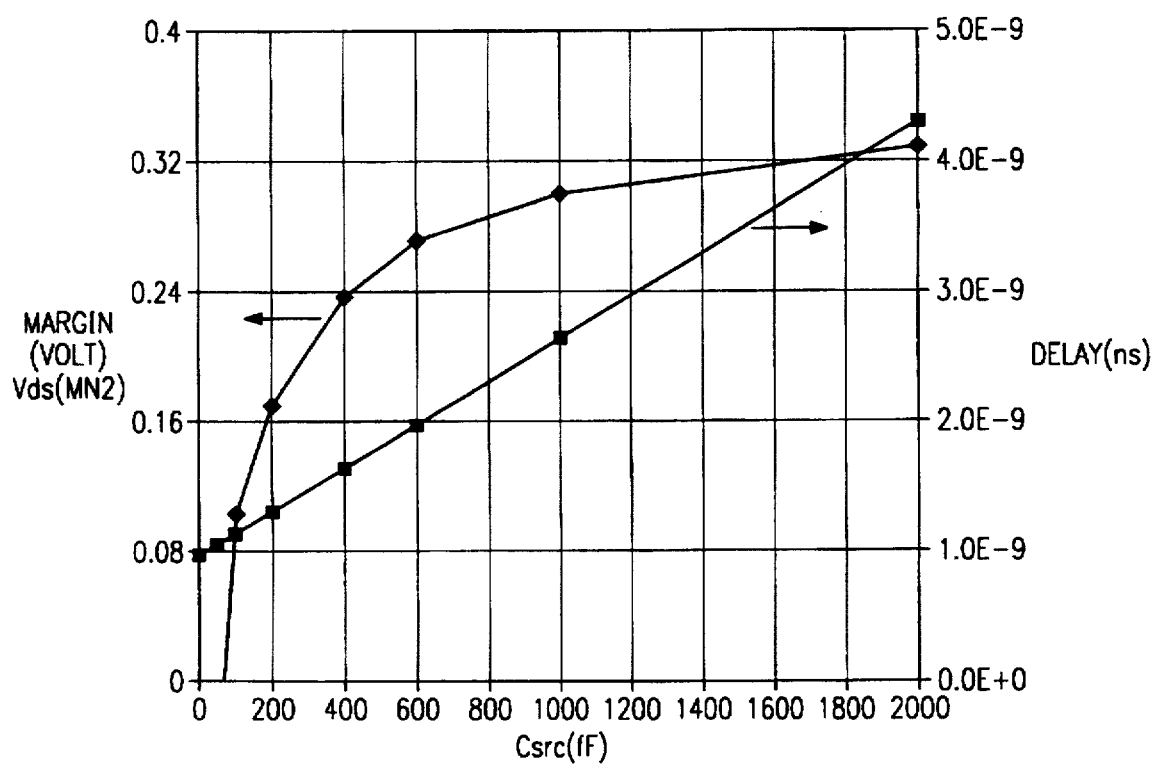
FIG. 4 describes the relationship between the write cell margin in volts and delay in seconds using features of the present invention.

FIG. 4 is an exemplary graph of the write cell margin in volts and delay in seconds for a 5T MOS static RAM memory cell embodying concepts of the present invention. This figure demonstrates the phenomenon shown in FIG. 3. The rise time is a function of the value of source capacitance 36. By preloading a voltage on source capacitance 36 with write enable circuit 50 shown in FIG. 2, it is possible to decrease the rise time of the voltage at N3. For example, if reference voltage 54 was chosen to be 0.24 volts, and the source capacitance 36 was 100 fF, there would be approximately a $0.8 \times 10^{-9}$ second delay for the voltage to increase from 0.24 volts to 0.30 volts. In contrast, if no voltage had been loaded on source capacitance 36 initially, the entire $3.8 \times 10^{-9}$ seconds would be required for the voltage to increase to 0.3 volts. Thus, write enable circuit 50 decreases the delay experienced when writing to memory cell 12 because of source capacitance 36.

Figure 5:
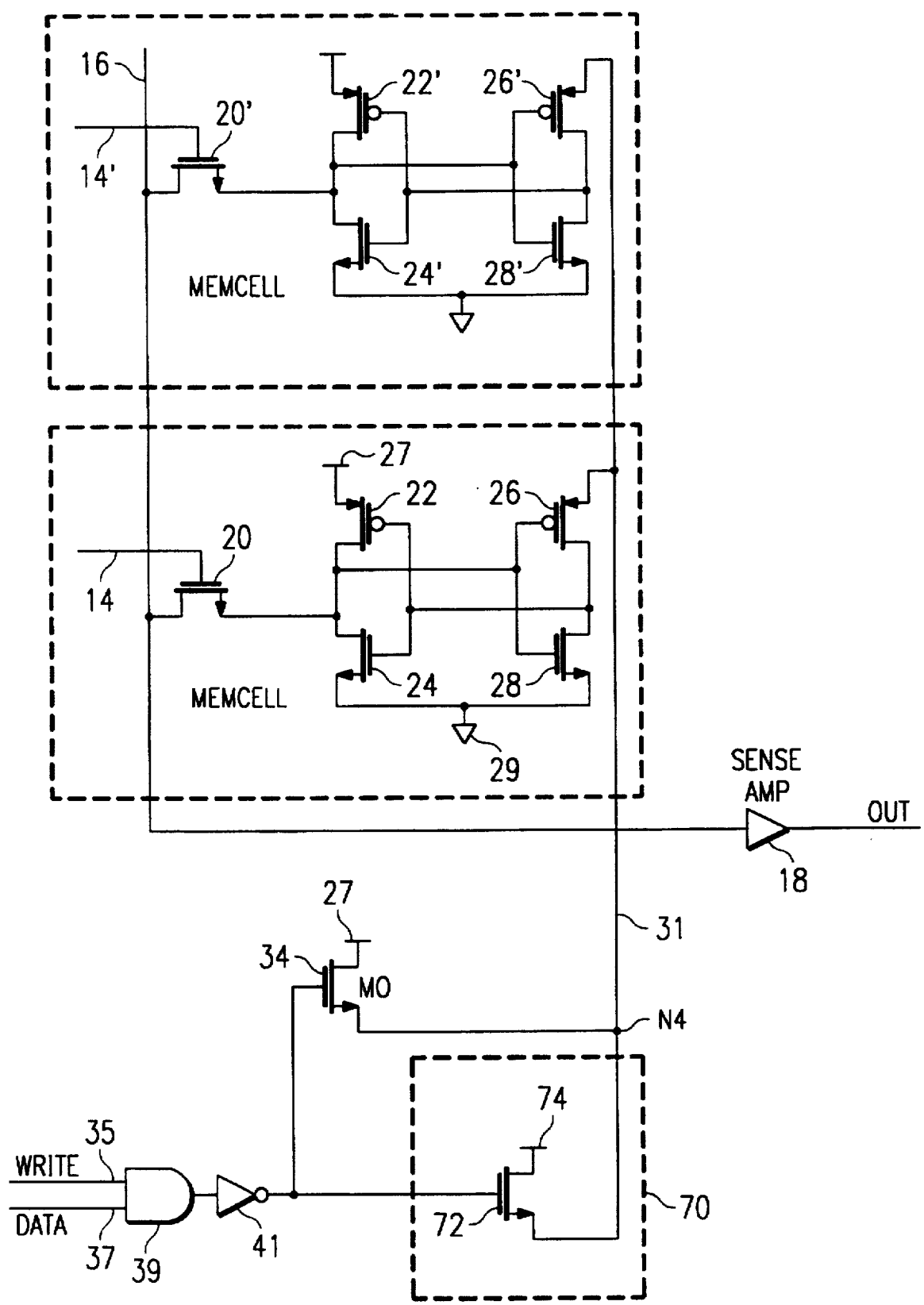
FIG. 5 presents an exemplary 5T MOS static RAM memory cell embodying concepts of the present invention utilizing an alternate location for the write enable transistor.

FIG. 5 is an exemplary 5T MOS static RAM array embodying concepts of the present invention utilizing an alternate location for write enable transistor 34. In this case, the source of transistors 24 and 28 are tied together to ground voltage 29. In addition, the source of transistor 26 of each memory cell 12 is coupled to the source of write enable transistor 34. The drain of write enable transistor 34 is coupled to source voltage 27, and the source of write enable transistor 34 is coupled to Node 4 (N4). The gate of write enable transistor 34 is coupled to the output of signal inverter 41. Signal inverter 41 inverts the output of AND gate 39. The inputs to AND gate 39 are WE signal 35 and data signal 37. Thus, write enable transistor 34 couples N4 to source voltage 27 unless logic 1 is being written to memory cell 12.

Reference voltage circuit 70 is also coupled to N4. Circuit 70 includes transistor 72 and reference voltage 74. Transistor 72 may be a P-channel or an N-channel MOS transistor, but is an N-channel MOS transistor in the embodiment shown in FIG. 5. The gate of transistor 72 is coupled to the output of AND gate 39. The inputs to AND gate 39 are WE signal 35 and data signal 37. The source of transistor 72 is coupled to reference voltage 74, and the drain of transistor 72 is coupled to N4. Thus, transistor 72 couples N4 to reference voltage 74 whenever logic 1 is being written to memory cell 12.

Reading memory cell 12 of FIG. 5 is performed by setting WL 14 of memory cell 12 to logic 1, which turns on transistor 20 and impresses the logic 0 or logic 1 stored in memory cell 12 on BL 16. When writing a logic 1 over a logic 0, though, transistors 22 and 24 are on, which causes the voltage at N1 to be approximately $V_g$ and inhibits transistors 26 and 28 from changing states. Reference voltage circuit 70 alleviates this condition by imposing reference voltage 74 at N4 when writing a logic 1 to a memory cell. The voltage at N2 is subsequently pulled down from approximately $V_s/2$ to approximately one-half of the voltage of reference voltage 74, which in turn lowers the voltage required at N1 to cause transistors 26 and 28 to change state.

Figure 6A:
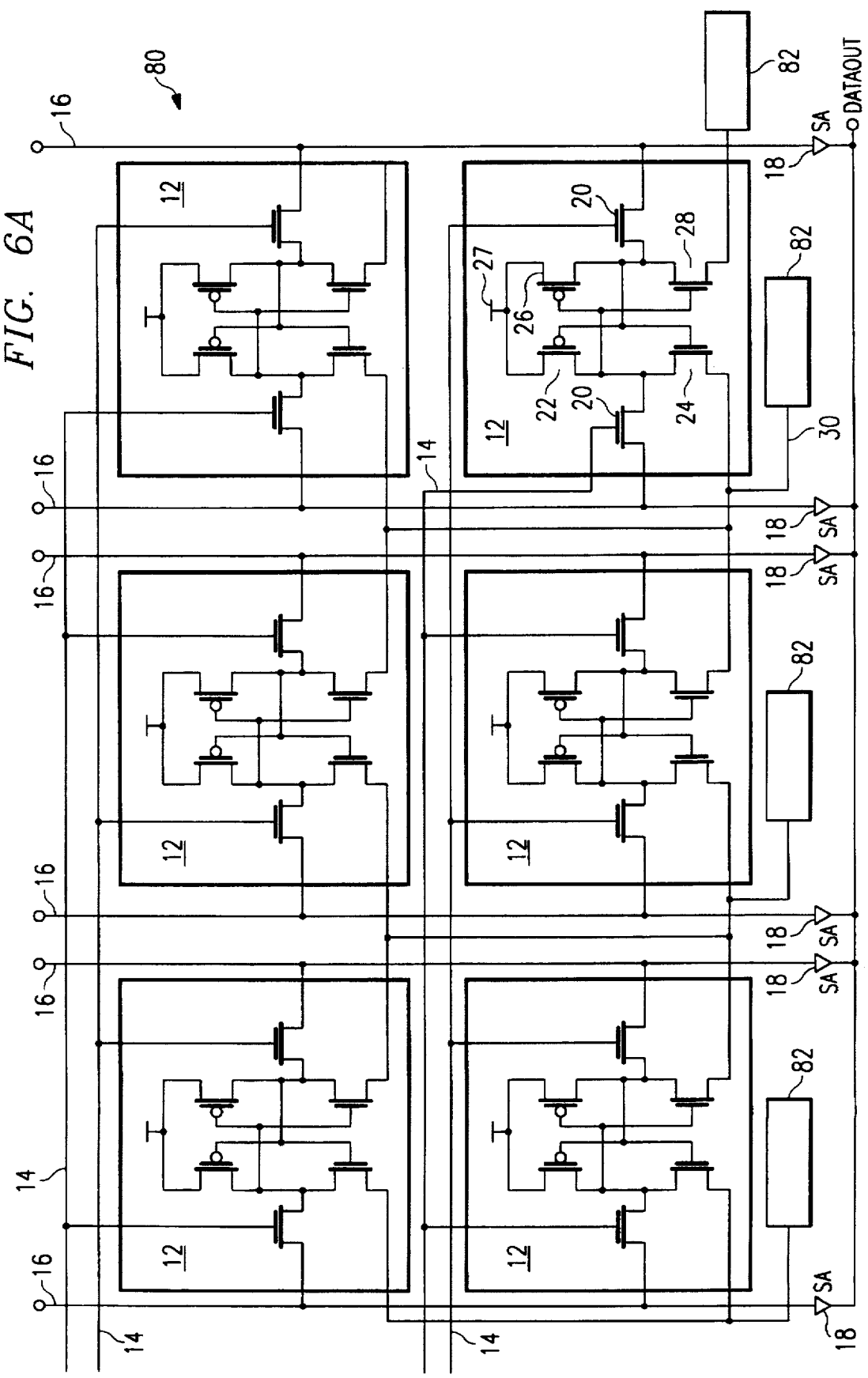
FIG. 6A is an exemplary circuit diagram of a 6T MOS static RAM dual port memory cell array embodying concepts of the present invention.
Figure 6B:
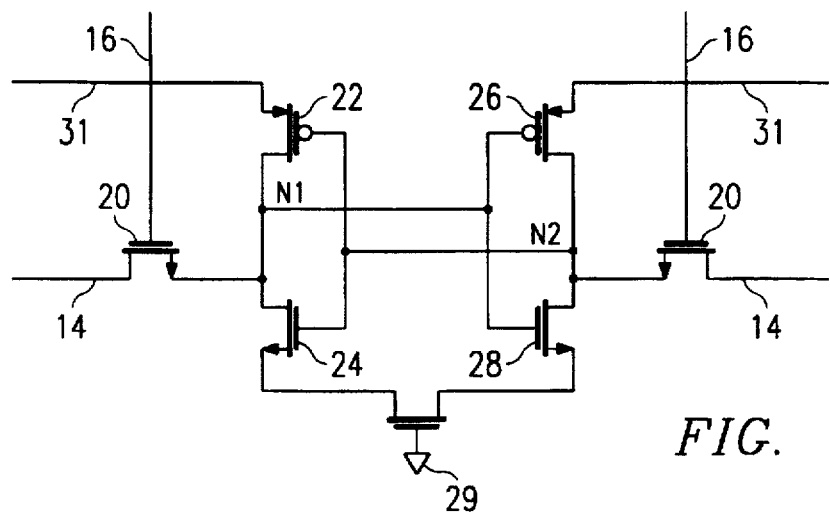
FIG. 6B shows an alternate memory cell configuration for a dual port memory cell.
Figure 6C:
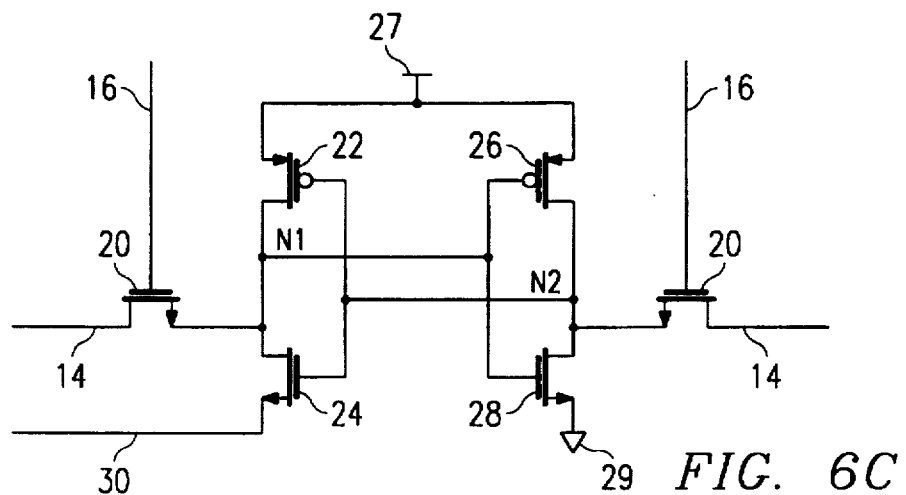
FIGS. 6C and 6D illustrate configurations for memory cells having a second read-only port.
Figure 6D:
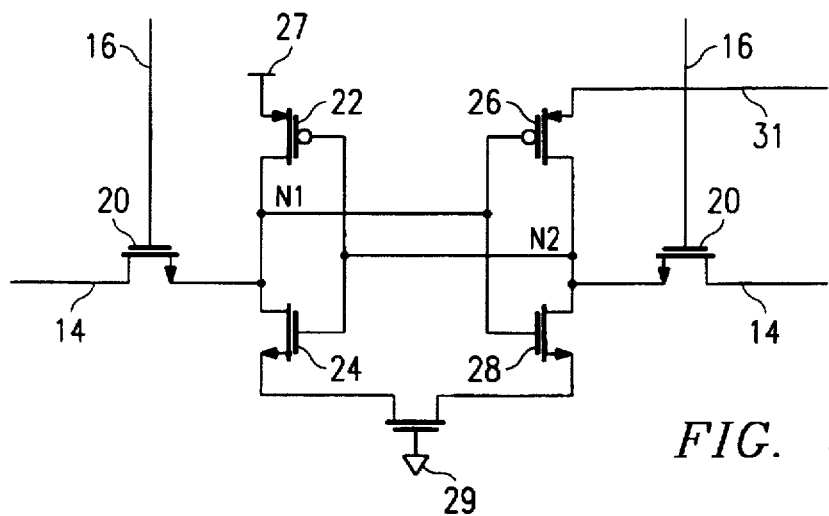

FIG. 6A is an exemplary circuit diagram of a 6T MOS static RAM dual port memory array 80 embodying concepts of the present invention. Each BL 16 of 6T dual port memory array 80 is functional to read or write to an associated memory cell 12, and each memory cell also has two independent WLs 14. Thus, dual port array memory cell 80 has two independent read and write ports. SRC control circuit 82 includes all circuitry common to write enable transistor 34, such as write speed-up circuit 50 and noise reduction circuit 40. FIG. 6B shows an alternate memory cell configuration for a dual port array memory cell, and FIGS. 6C and 6D show alternate memory cell configurations for memory cells that have a second read-only port. This second read-only port includes BL 16 and WL 14 that may read but not write to memory cell 12, because of the absence of parallel connections to a write enable transistor 34 as shown in FIGS. 6A and 6B.

Although the present invention has been described in detail, it should be understood that various changes, substitutions, and alterations can be made hereto without departing from the spirit and scope of the invention as defined by the appended claims.

What is claimed is:

1. A method for operating a single sided static RAM array, the method comprising the steps of:

selecting at least one single sided memory cell in the array of memory cells;

decoupling the at least one single sided selected memory cell in the array from one of a voltage source or a voltage ground responsive to a write enable signal; and writing to the least single sided one memory cell;

deslecting the at least single sided one memory cell; and coupling the at least one selected single sided memory cell to the one of the voltgae source or the voltage ground.

2. The method of claim 1, wherein the step of decoupling comprises decoupling the source of an N-channel MOS transistor from the voltage ground to prevent the source from depressing the voltage at the drain.

3. The method of claim 2 wherein the step of decoupling further comprises decoupling the source of a P-channel MOS transistor from the voltage source and further comprising the step of coupling the source of the P-channel MOS transistor to a reference voltage.

4. The method of claim 1, further comprising the step of:

applying a reference voltage to a memory cell responsive to the write enable signal to facilitate the operation of writing to the memory cell.

5. The method of claim 1, further comprising the step of:

conducting current from a memory cell responsive to the write enable signal to facilitate the writing to the memory cell.

* * * * *

UNITED STATES PATENT AND TRADEMARK OFFICE
CERTIFICATE OF CORRECTION

PATENT NO. : 5,894,434
DATED : April 13, 1999
INVENTOR(S) : Hiep Van Tran

It is certified that error appears in the above-identified patent and that said Letters Patent is hereby corrected as shown below:

Title Page, insert the following item:

--[60] Provisional application No. 60/009,177, Dec. 22, 1995--

Column 1, line 2, insert the following:
--CROSS REFERENCE TO RELATED APPLICATION
Reference is made to and priority claimed from U.S. provisional application Ser. No. 60/009,177, Dec. 22, 1995.--

Signed and Sealed this

Eleventh Day of July, 2000

Attest:

Q. TODD DICKINSON

*Attesting Officer*    *Director of Patents and Trademarks*